United States Patent [19]

Glass

[11] Patent Number: 5,363,499
[45] Date of Patent: Nov. 8, 1994

[54] CAM FOR OUTPUTTING CONTROL SIGNALS OF ACTION FIELDS IN RESPONSE TO MATCHES OF INPUTTING DIGITAL TIMER SIGNALS WITH DATA IN COMPARING FIELDS

[75] Inventor: Kevin W. Glass, San Jose

[73] Assignee: SGS-Thomson Microelectronics, Inc., Carrollton, Tex.

[21] Appl. No.: 168,583

[22] Filed: Dec. 15, 1993

Related U.S. Application Data

[63] Continuation of Ser. No. 359,842, May 31, 1989, abandoned.

[51] Int. Cl.$^5$ .................... G06F 7/02; G06F 15/409
[52] U.S. Cl. ................ 395/425; 364/DIG. 1; 364/253.1; 364/252.3; 364/259.2
[58] Field of Search .............. 395/425; 365/49

[56] References Cited

U.S. PATENT DOCUMENTS

| | | |
|---|---|---|
| 3,800,286 | 3/1974 | Brown et al. . |
| 3,949,369 | 4/1976 | Churchill, Jr. . |
| 4,845,668 | 7/1989 | Sano et al. ............................ 365/49 |
| 4,975,873 | 12/1990 | Nakabayashi et al. ............. 365/49 |
| 4,982,360 | 1/1991 | Johnson et al. . |
| 4,996,666 | 2/1991 | Duluk, Jr. ............................ 365/49 |

FOREIGN PATENT DOCUMENTS

| | | |
|---|---|---|
| 0055305A1 | 7/1982 | European Pat. Off. . |
| 0130246A1 | 1/1985 | European Pat. Off. . |
| 0273539A2 | 6/1988 | European Pat. Off. . |
| WO88/02887 | 4/1988 | WIPO . |

Primary Examiner—Parshotam S. Lall
Assistant Examiner—Krisna Lim
Attorney, Agent, or Firm—Kenneth C. Hill; Richard A. Bachand; Lisa K. Jorgenson

[57] ABSTRACT

A content addressable memory has a plurality of entry locations. Each entry location includes a comparison field and an action field. Comparitors are provided for each entry location, so that an input provided to the memory is compared simultaneously to the comparison fields of every entry. The action fields of all entries which match the input value are combined to generate a single output value. Each entry includes a bit which indicates whether such entry is to be deleted when a match occurs with an input value. Each entry in the memory can be assigned an arbitrary label for use in direct accessing by a central processor unit.

7 Claims, 2 Drawing Sheets

CAM FOR OUTPUTTING CONTROL SIGNALS OF ACTION FIELDS IN RESPONSE TO MATCHES OF INPUTTING DIGITAL TIMER SIGNALS WITH DATA IN COMPARING FIELDS

This is a continuation of copending application(s) Ser. No. 07/359,842 filed on May 31, 1989 now abandoned.

BACKGROUND OF THE INVENTION

1. Field of the Invention

The present invention relates generally to digital computer systems, and more specifically to a content addressable memory suitable for use with real time controllers and similar subsystems.

2. Description of the Prior Art

In digital real time control systems, a central processing unit is typically heavily burdened keeping track of timing, occurrence of events, and control of output signals. Examples of systems making use of real time controllers are automobile engine controllers, printers, computer disk and tape drive controllers, and electric motor controllers generally.

System designers generally attempt to have various parts of this system handle as much of the load as possible. This tends to minimize the burden on the central processor to keep up with the timing of numerous events. Various smart peripherals, timers, controllers, and so forth can be used to minimize the burden on the central processing unit. These peripheral subsystems typically perform functions related to handling simple, expected events.

It is common to have control events occur relative to a timer. This timer can be a real time timer, such as a time of day clock, or a counter incremented by regularly occurring external events such as rotation of a shaft. To keep track of scheduled control events, a content addressable memory can be used. A content addressable memory is a memory which is addressed by the value of the contents stored therein rather than by an address in an address space.

The various entries in the content addressable memory define times at which control events are to occur. The current value of a timer is compared to the contents of the content addressable memory, and a match between the current value of the timer and the contents of an entry in the memory indicate that a scheduled control event should occur at the present time.

Each entry in the content addressable memory typically has two fields. A comparison field contains the values to be compared to the timer or other inputs. An action field contains output values which are output when the input value matches with the comparison field.

In typical current systems, a standard random access memory plus lo decode logic is used as a substitute for a true content addressable memory. Each time a memory cycle occurs, each location in the random access memory is read. Typically, a counter is used to increment addresses into the random access memory, so that each location is read once for each memory cycle. The contents of a timer or other input are compared to the comparison field for each entry in the random access memory; if any matches occur the corresponding action field entry defines any actions to be taken. Such a subsystem is not a true content addressable memory, but behaves much as one for many purposes.

In a true content addressable memory, no memory addresses are generated. Each time a memory cycle occurs, an input value is compared simultaneously to the comparison field of every entry in the memory. No output is generated unless one or more entries in the content addressable memory have a comparison field value equivalent to the input value.

In order to read the contents of a memory location in the content addressable memory, an input value is applied to the memory. If there is a match with the contents of the comparison field of a memory entry, the rest of that memory entry can be read out. Specific entries in the memory are not easily accessed directly. Updating a content addressable memory tends to be very inefficient, and this is especially true when a random access memory is used as described above to model a content addressable memory. Updating or deleting specific entries in the content addressable memory can be difficult.

It would therefore be desirable to provide a true content addressable memory suitable for use with real time controllers and similar systems. It would be further desirable for selected entries in the memory to be easily accessed directly, in order to simplify memory updates and entry deletions.

SUMMARY OF THE INVENTION

It is therefore an object of the present invention to provide a content addressable memory which adequately supports real time control functions.

It is a further object of the present invention to provide such a content addressable memory in which selected entries are easily accessed directly.

It is another object of the present invention to provide such a content addressable memory for which updates and deletions of selected entries are performed in a simple manner.

It is yet another object of the present invention to provide such a content addressable memory which provides automatic deletion of selected entries which are intended for a one time use.

It is yet another object of the present invention to provide such a content addressable memory which can efficiently support the use of several different timers and counters.

It is yet a further object of the present invention to provide such a content addressable memory which cleanly handles multiple control events occurring at a single scheduled time.

Therefore, in accordance with the present invention, a content addressable memory has a plurality of entry locations. Each entry location includes a comparison field and an action field. Comparators are provided for each entry location, so that an input provided to the memory is compared simultaneously to the comparison fields of every entry. The action fields of all entries which match the input value are combined to generate a single output value. Each entry includes a bit which indicates whether such entry is to be deleted when a match occurs with an input value. Each entry in the memory can be assigned an arbitrary label for use in direct accessing by a central processor unit.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

Figure 1:
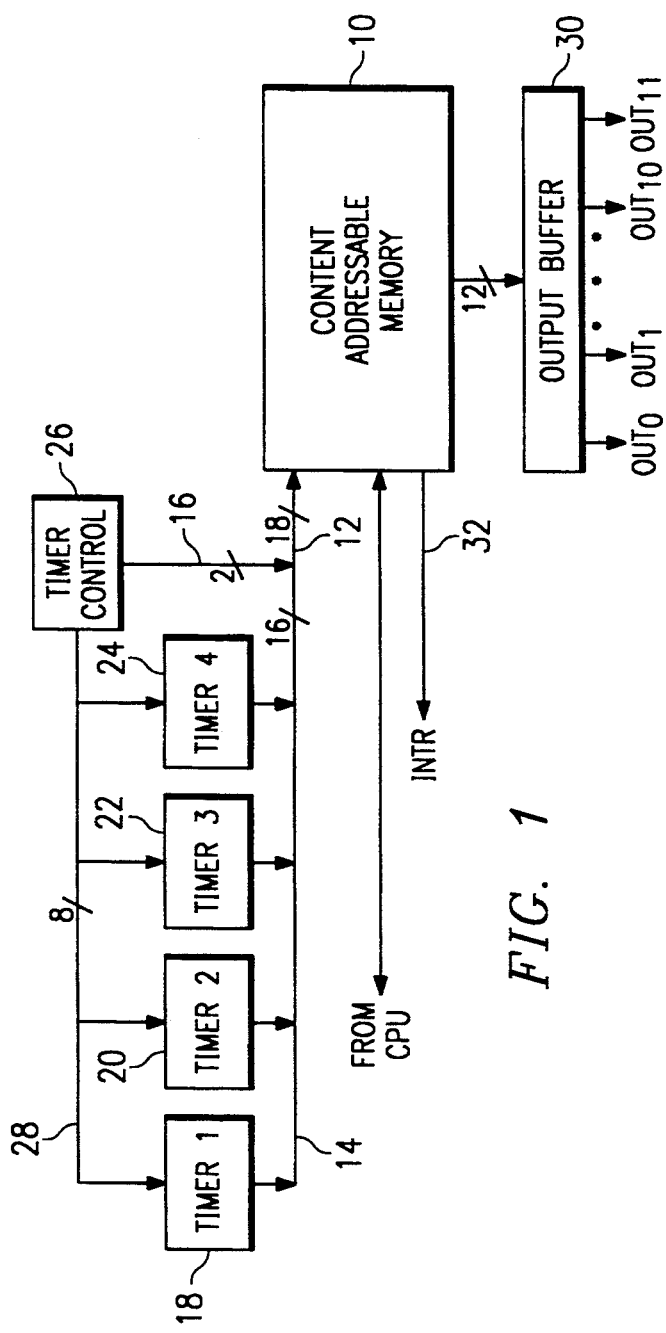
FIG. 1 is a block diagram of a portion of a real time control system including a content addressable memory.

Referring to FIG. 1, a content addressable memory 10 accepts inputs from an input bus 12. The signals on the input bus 12 include a 16 bit signal obtained from a timer bus 14, plus two additional bits obtained from timer control lines 16.

Four timers 18, 20, 22, 24 have outputs connected to the timer bus 14. Timer control 26 determines which timer 18, 20, 22, or 24 is connected to the timer bus 14 through the use of timer address lines 28. A two bit signal indicating which timer 18, 20, 22, 24 is connected to the timer bus 14 is included in the input bus 12 signals through a signal supplied to the timer control lines 16.

The various timers can be free running timers, such as time of day clocks, or counters which count externally occurring events such as shaft rotations. For example, TIMER1 18 and TIMER2 20 can be time of day clocks for measuring real time intervals. TIMER3 22 and TIMER4 24 can be counters connected to inputs (not shown) for counting the number of occurrences of preselected external events. Preferably, all of the timers 18, 20, 22, 24 are programmable, so that the counting rates and timer cycle period of the various timers will typically be different.

An output buffer 30 is connected to the memory 10, and provides control output signals for various selected controlled devices. In the embodiment shown in FIG. 1, 12 separate single-bit control lines, $OUT_0$, $OUT_1$, . . . $OUT_{10}$, $OUT_{11}$ are provided. These OUT signals are used to control switches, solenoids, and other electronic devices as known in the art. The OUT signals are driven by 12 signal lines out of the content addressable memory 10. They are typically latched, and programmable so that an output line can be either a copy of the signal line from the memory 10, or it can toggle whenever a logical 1 is received from the memory 10.

Inputs are provided to the memory 10 from a central processor (not shown), and various signals are provided to the central processor from the memory 10. At least an interrupt line 32 provides and interrupt signal INTR on which central processor interrupts can be raised as known in the art.

Figure 2:
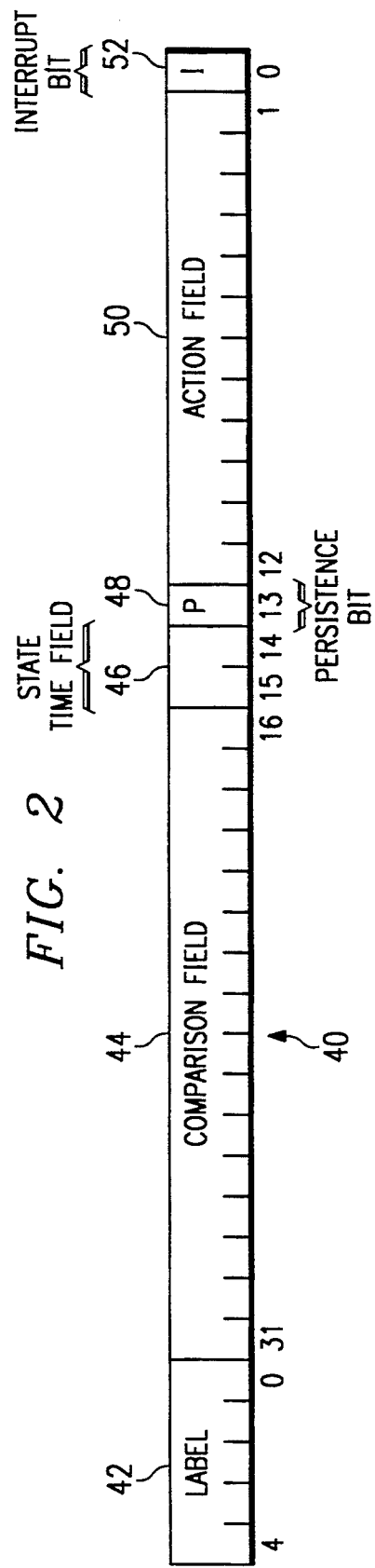
FIG. 2 illustrates the bit fields in one entry of a preferred content addressable memory according to the present invention.

The content addressable memory 10 has a plurality of entries. It is not required that all of the entries be used at any given time. FIG. 2 shows the contents of each entry in the memory 10.

Each entry 40 contains a 5 bit label field 42. A comparison field 44 is 16 bits wide, and a state time field 46 is 2 bits wide. A persistence bit field 48 is a single bit, and an action field 50 is 12 bits wide. An interrupt bit 52 is the last item for each entry. Exclusive of the label field 42, each entry 40 is 32 bits wide.

The label field 42 is used by the central processor to identify selected entries in the content addressable memory. It is generally used only for those entries for which the central processor expects to be changing or deleting periodically, and is usually not used for every entry in the memory.

The 16 bit comparison field 44 is combined with the 2 bit state time field 46. These 18 bits are compared to values input on the input bus 12. The comparison field 44 corresponds to possible timer values, while the state time field 46 identifies which timer this entry relates to. Use of the state time field 46 ensures that the comparison field 44 triggers an output action only when the current time matches with a control event time on a selected timer out of those available.

The action field 50 contains 12 bits which generate the OUT signal sent to the output buffer 30. When the comparison field 44 and the state time field 46 match the value on the input bus 12, the contents of the action field 50 are sent to the output buffer 30.

The persistence bit 48 indicates whether this entry is a one time event or a repeating event. A zero in the persistence field 48 indicates that this is a repeating control event, and this entry remains valid in the content addressable memory after a match is made with the input value. If the persistence bit 48 has a value of 1, the current entry is a one time event, and this entry will be deleted from the content addressable memory after the first match occurs in the comparison field 44 and the state time field 46. Thus, the control outputs defined by the action field 50 are generated only one time if the persistence bit 48 is set to 1.

Interrupt bit 52 indicates whether a processor interrupt is raised when a match is made for this entry. This can be used to interrupt the central processor in order to perform relatively complex routines. For example, an interrupt could be raised on a one time event in order to indicate to the central processor that it is now time to recalculate operating parameters for the control system, and perhaps update other, repeating entries in the content addressable memory. In most cases, it is only necessary to perform a simple control action as defined in the action field 50, and it is not necessary to interrupt the central processor.

Figure 3:
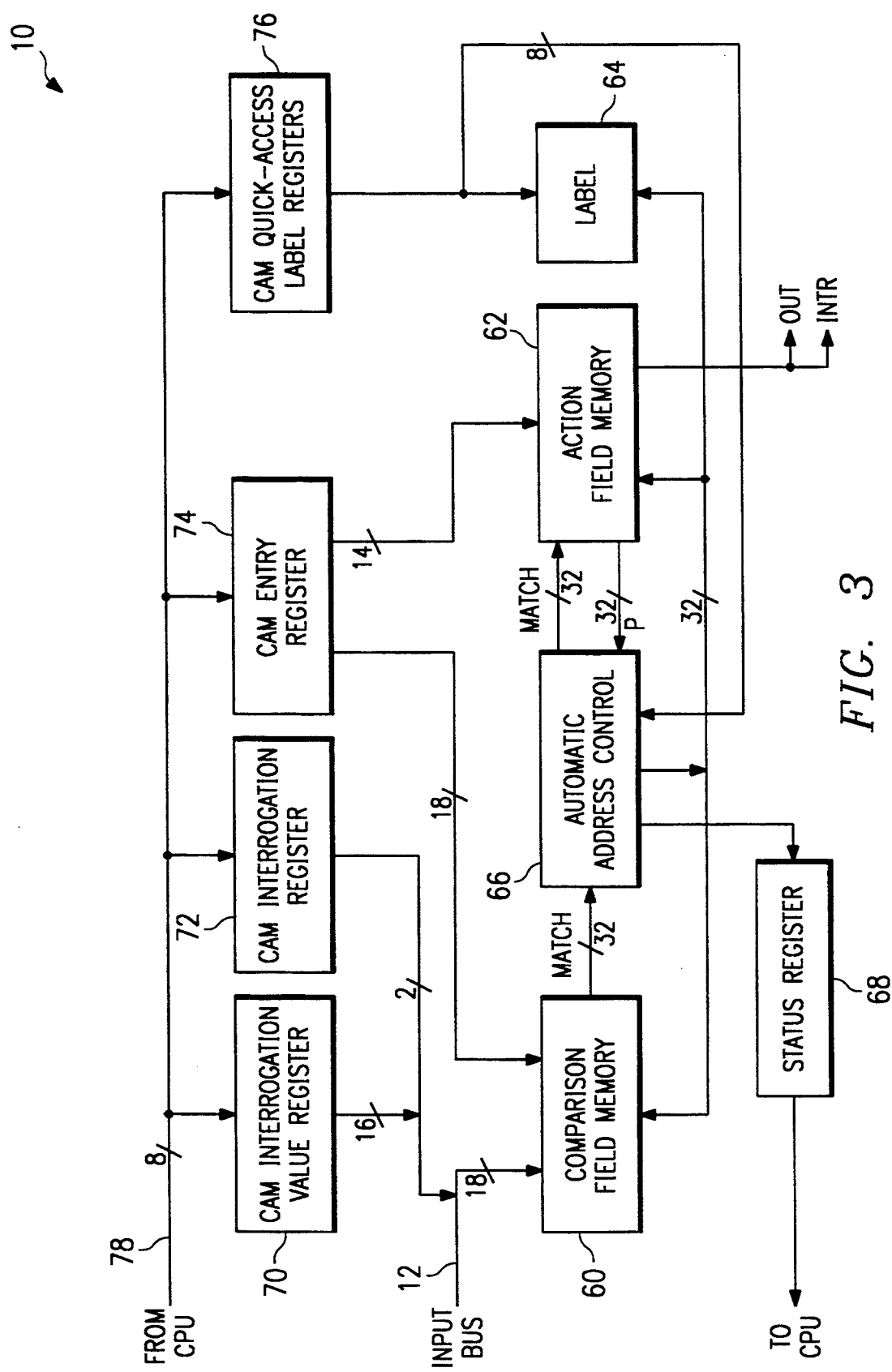
FIG. 3 is a block diagram indicating data path connections within a content addressable memory according to the present invention.

Referring to FIG. 3, data paths within the content addressable memory 10 are shown. A comparison field memory block 60 includes the comparison field 44 and state time field 46 field for each entry in the memory. In addition, comparators for comparing input values to these fields are included in the comparison field block 60.

An action field block 62 contains the persistence bit 48, action field 50, and interrupt bit 52 portions of each memory entry. A label memory block 64 contains the label field 42 for each entry in the memory.

Automatic address control circuitry 66 controls selection of memory entries as will be described below. A status register 68 is connected to the auto address circuitry 66, and returns status bits to the central processor.

Four input registers are used to communicate information from the central processor into the content addressable memory 10. These registers are the CAM interrogation value register 70, the CAM interrogation register 72, the CAM entry register 74, and the CAM quick access label registers 76. These registers are accessed by the central processor over an 8 bit data bus 78, and have functions which will be described below.

A preferred embodiment described in connection with FIG. 3 is a content addressable memory having 32 possible entries. As will be appreciated by those skilled in the art, memories having a greater or lesser number of entries can be designed in accordance with the principles described in FIG. 3.

In normal operation, an input value to be matched with the comparison field 44 and state time flag entry 46 is input to the memory 10 on input bus 12. As described in connection with FIG. 1, input bus 12 includes 16 bits for the comparison field 44, and 2 bits to indicate which timer is currently placing comparison information onto the bus. Each entry in the comparison field memory block 60 contains an 18 bit comparator, and every entry is compared simultaneously to the input on the comparison bus 12. Thirty-two signal lines, one bit for each entry in the comparison field memory block 60, are connected to the automatic addressing control 66. Each entry in the comparison field memory block 60 which matches the value on the input bus 12 generates a 1 output to auto address circuitry 66. Each 1 indicates that a match has been found, and that the corresponding action field entry should be output.

The 32 bits of match information are passed along to the action field memory block 62. The action fields for all entries which match the input are logically OR'd together to generate the output signal OUT. Any entries in the action field which match the input place the value of their persistent bit field 48 onto 32 additional signal lines which are connected back to the auto addressing circuitry 66. As described above, a 1 on one of these lines indicates that the corresponding entry should now be deleted.

Internally, the automatic addressing control circuitry 66 maintains a bit map indicating which entries have valid information. When a new entry is entered into the content addressable memory 10 the auto addressing circuitry 66 selects an unused memory position to be used for that entry. A 32 bit register plus control circuitry (not shown) to select a free location is sufficient to perform this function. When a persistence bit returned from the action field memory block 62 indicates that an entry, now matched, is to be deleted, the appropriate bit in the internal register is reset to indicate that that entry is now available for reuse. This register in the auto addressing circuitry 66 is also compared to the match bits received from the comparison field memory block 60, ensuring that invalid entry locations do not generate match bits which are passed to the action field memory block 62.

The CAM interrogation value register 70 and CAM interrogation register 72 work together to allow the central processor to interrogate the contents of the content addressable memory 10 by matching the comparison field. A 16 bit comparison value is written to the CAM interrogation value register 70 during two bus 78 cycles, followed by a one byte write to the CAM interrogation register 72. The value written to the CAM interrogation register 72 includes a two bit state time field, which, when combined with the 16 bits of register 70, provide an 18 bit input value which can be connected to the comparison field memory block 60 through input bus 12. Three other bits in the CAM interrogation register 72 can be used to define the interrogation function. A first bit is set in order to indicate that the comparison value is to be checked for, and a flag bit will be set in the status register 68 if the comparison value is present in the content addressable memory 10. A second bit is set if all entries matching the specified input value are to be cancelled, and a third bit is set in order to cancel every entry in the content addressable memory 10. For the first two functions, the timer value to be matched should be written into the CAM interrogation value register 70 first, followed by a write of the appropriate value into the CAM interrogation register 72. For the cancel all entries function, a simple write into the CAM interrogation register 72 will suffice. The three interrogation functions are mutually exclusive, so that only one function can be asserted at a particular time.

The CAM entry register 74 is used to load new entries into the memory 10. The CAM entry register 74 is a 32 bit register, which is loaded one byte at a time during four separate bus 78 cycles. When the fourth byte is written into the CAM entry register 74, the entire 32 bit entry is written directly into the comparison field memory block 60 and the action field memory block 62. Eighteen bits are written into the comparison field memory block 60 and 14 bits are written into the action field memory block 62.

The CAM quick-access label register 76 is used to more efficiently access selected entries using their labels. This is an alternative technique to determining whether an entry is present through use of the CAM inquiry register 72 and CAM inquiry value register 70. Register 76 contains 5 bits for a label, and 3 bits indicating the function to be performed. As in the functions provided by the CAM inquiry register 72, these three functions are mutually exclusive and only one may be activated at a time.

The first function provided by the CAM quick-access label register 76 is a new label entry function. When this bit is set, a new entry and corresponding label are being written to the memory 10. When the fourth byte of the new entry is written into the CAM entry register 74, the new label will be written to the label memory block 64 at the same time that the new entry is written to the comparison field memory block 60 and the action field memory block 62. This label is used by the auto address circuitry 66 to determine which of the 32 entries is referred to by a particular label.

The second function which can be performed through the CAM quick-access label register 76 is to change the entry associated with a label. When this function bit is set, the same entry location currently matched with the label contained in register 76 is overwritten with the new entry contained in the CAM entry register 74. As before, the entry is actually overwritten at the time that the fourth byte is written into the CAM entry register 74. This allows a particular labelled entry to be easily changed.

The final function provided by the CAM quick-access label register 76 is to delete an entry associated with a label, and free that entry location for reuse. When a labelled entry is deleted, it is not necessary to write any information into the CAM entry register 74.

A content addressable memory has been described which allows matching of comparison fields for every entry in the memory with the current values of selected timers. As described above, multiple timers can be provided, and the comparison occurs on both the current value of the selected timer and the identification of the selected timer. Although 4 timers have been shown, comparison with other numbers of timers can easily be performed. For example, making the state time field 3 bits wide instead of 2 would allow the use of 8 timers. One complete memory cycle can be considered to be the comparison of the current value of all of the timers with the entries in the content addressable memory. Using more timers will increase the cycle time of the memory.

The entries in the content addressable memory can be accessed in a traditional manner by comparing the contents of the comparison fields with input values provided by the central processor. In addition, an alternative, more efficient, means for accessing selected entries in the memory is provided through the use of the label field attached to each memory entry. For control applications in which entries must be changed frequently, the use of the label field provides greatly increased efficiency.

The use of the persistence bit to indicate whether an entry is to be used only once, or multiple times, frees the central processor from having to delete an entry which is to be used only one time. When the persistence bit indicates that an entry is intended for only one use, that entry is deleted automatically within the content addressable memory when it is matched.

While the invention has been particularly shown and described with reference to a preferred embodiment, it will be understood by those skilled in the art that various changes in form and detail may be made therein without departing from the spirit and scope of the invention.

I claim:

1. A content addressable memory for connection to receive digital timer output signals for outputting control signals in response to said digital timer output signals, said content addressable memory, comprising:
   a plurality of memory data entries, each entry including: a comparison field for containing data for comparison with said digital timer output signals, and a corresponding action field for containing data to be outputted from said memory when a timer output signal matches data in the comparison field;
   circuitry for simultaneously comparing the digital timer output signals to data contained in the comparison fields of each of said plurality of entries; and
   circuitry operative when said digital timer output signals match the contents of said comparison field for outputting data from the corresponding action fields of said plurality of memory entries.

2. The content addressable memory of claim 1 wherein said content addressable memory is adapted for connection to receive digital timer output signals from a plurality of timers, and wherein said plurality of memory data entries each further comprise a timer select field for selectively identifying the digital output timer signals of one of said timers for comparison to said comparison fields.

3. The content addressable memory of claim 1 wherein said plurality of memory data entries each further comprise a label, and wherein each entry can be referenced through said label.

4. The content addressable memory of claim 1 wherein said plurality of memory data entries each further comprise a persistence bit the state of which indicates whether contents of the entry will be automatically deleted when the digital timer output signals matches the comparison field of the entry.

5. The content addressable memory of claim 1 wherein, if the data of more than one comparison field matches a digital timer output signal, the data in the respective corresponding action fields are logically combined.

6. The content addressable memory of claim 5 wherein logically combined data are combined using a logical OR operation.

7. The content addressable memory of claim 1 wherein said plurality of memory data entries each further comprise an interrupt bit to indicate if a central processor interrupt will be generated when the digital timer output signals matches the comparison field of an the entry.

* * * * *